US011659656B2

(12) United States Patent
Tomoda

(10) Patent No.: US 11,659,656 B2
(45) Date of Patent: *May 23, 2023

(54) STRETCHABLE WIRING BOARD

(71) Applicant: Murata Manufacturing Co., Ltd., Nagaokakyo (JP)

(72) Inventor: Takahito Tomoda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/847,233

(22) Filed: Jun. 23, 2022

(65) Prior Publication Data

US 2022/0330424 A1 Oct. 13, 2022

Related U.S. Application Data

(63) Continuation of application No. 17/212,508, filed on Mar. 25, 2021, now Pat. No. 11,406,011, which is a (Continued)

(30) Foreign Application Priority Data

Jan. 21, 2019 (JP) .............................. JP2019-007740

(51) Int. Cl.
*H05K 1/02* (2006.01)
*H05K 1/18* (2006.01)

(52) U.S. Cl.
CPC ........... *H05K 1/0283* (2013.01); *H05K 1/189* (2013.01); *H05K 2201/09245* (2013.01); (Continued)

(58) Field of Classification Search
CPC ................. H05K 1/0283; H05K 1/189; H05K 2201/09245; H05K 2201/09872; (Continued)

(56) References Cited

U.S. PATENT DOCUMENTS 6,362,433 B1 * 3/2002 Takahashi ................ H05K 3/28
174/255
8,653,512 B2 * 2/2014 Auman ............... C08G 73/1071
257/40
(Continued)

FOREIGN PATENT DOCUMENTS

JP      H0951000 A      2/1997
JP      2015119071 A    6/2015
(Continued)

OTHER PUBLICATIONS

Written Opinion of the International Search Authority issued for PCT/JP2019/048992, dated Mar. 3, 2020.
(Continued)

*Primary Examiner* — Hoa C Nguyen
(74) *Attorney, Agent, or Firm* — ArentFox Schiff LLP

(57) ABSTRACT

A stretchable wiring board that includes a stretchable substrate having a first main surface with a first region, a second region adjacent the first region, and a third region adjacent the second region; a first stretchable wiring line on the first main surface and extending over the first region; an insulating layer extending over the first region and the second region; and a second stretchable wiring line extending over the first region, the second region, and the third region. When a thickness of the insulating layer is defined as Z2, and when a minimum value of a length of the second region in an extending direction of the second stretchable wiring line in a plan view of the stretchable wiring board is defined as Y, Y>Z2.

14 Claims, 2 Drawing Sheets

Related U.S. Application Data continuation of application No. PCT/JP2019/048992, filed on Dec. 13, 2019.

(52) U.S. Cl.
CPC ............ *H05K 2201/09872* (2013.01); *H05K 2201/09909* (2013.01); *H05K 2201/1003* (2013.01); *H05K 2201/10015* (2013.01); *H05K 2201/10022* (2013.01); *H05K 2201/10166* (2013.01)

(58) Field of Classification Search
CPC ......... H05K 2201/09909; H05K 2201/10015; H05K 2201/10022; H05K 2201/1003; H05K 2201/10166
See application file for complete search history.

(56) References Cited

U.S. PATENT DOCUMENTS

| | | | | |
|---|---|---|---|---|
| 8,987,707 | B2* | 3/2015 | Arnold | H01L 29/66439 |
| | | | | 257/29 |
| 9,740,035 | B2* | 8/2017 | Kwon | H01L 27/124 |
| 10,595,042 | B2* | 3/2020 | Sasai | H04N 19/44 |
| 10,595,402 | B2 | 3/2020 | Iwase | |
| 10,959,326 | B2* | 3/2021 | Okimoto | H01B 7/06 |
| 2008/0257586 | A1* | 10/2008 | Chen | H05K 1/0283 |
| | | | | 29/829 |
| 2017/0245362 | A1* | 8/2017 | Iwase | H05K 1/095 |
| 2018/0052206 | A1* | 2/2018 | Rodriguez | G01R 31/343 |
| 2018/0092206 | A1 | 3/2018 | Iwase et al. | |
| 2020/0260573 | A1* | 8/2020 | Ogawa | H05K 3/0064 |
| 2020/0267835 | A1* | 8/2020 | Okimoto | H01B 7/08 |
| 2020/0281073 | A1* | 9/2020 | Okimoto | H05K 1/118 |
| 2021/0243891 | A1* | 8/2021 | Tomoda | H05K 3/4685 |

FOREIGN PATENT DOCUMENTS

| | | |
|---|---|---|
| JP | 2017183328 A | 10/2017 |
| JP | 2018164015 A | 10/2018 |
| JP | 2019140292 A | 8/2019 |

OTHER PUBLICATIONS

International Search Report issued for PCT/JP2019/048992, dated Mar. 3, 2020.

Extended European Search Report issued for EP Application No. EP 19 91 1964, dated Feb. 21, 2022.

\* cited by examiner

STRETCHABLE WIRING BOARD

CROSS REFERENCE TO RELATED APPLICATIONS

The present application is a continuation of U.S. application Ser. No. 17/212,508, filed Mar. 25, 2021, which is a continuation of International application No. PCT/JP2019/048992, filed Dec. 13, 2019, which claims priority to Japanese Patent Application No. 2019-007740, filed Jan. 21, 2019, the entire contents of each of which are incorporated herein by reference.

FIELD OF THE INVENTION

The present invention relates to a stretchable wiring board.

BACKGROUND OF THE INVENTION

In recent years, the state of a living body (for example, a human body) has been managed by acquiring and analyzing biological information by using a wiring board.

When a plurality of wiring lines are arranged on a wiring board, the wiring lines may cross each other. For example, Patent Document 1 discloses a method for forming a wiring layer having a protrudingly-crossing portion on a substrate.

Patent Document 1: Japanese Patent Application Laid-Open No. H09-51000

SUMMARY OF THE INVENTION

The wiring board attached to the living body is required to be a stretchable wiring board that can follow movement of the living body. Further, the above stretchable wiring board may also have a plurality of wiring lines arranged so as to overlap (for example, intersect) each other, and it is necessary to prevent a short circuit between the wiring lines. Therefore, to prevent a short circuit between the wiring lines, an insulating layer may be interposed between the plurality of wiring lines that overlap each other. As such, the portion where the wiring lines and the insulating layer are stacked may protrude greatly.

Patent Document 1 does not disclose that the substrate has stretchability. Even if the substrate has stretchability, there is a problem that, when the substrate stretches, stress tends to concentrate on the protrudingly-crossing portion of the wiring layer that protrudes greatly, and as a result, the wiring layer is easily broken.

The present invention has been made to solve the above problem, and it is an object of the present invention to provide a stretchable wiring board that can suppress breakage of a stretchable wiring line during stretching thereby preventing a short circuit between two stretchable wiring lines when the two stretchable wiring lines are arranged so as to overlap each other.

A stretchable wiring board according to the present invention includes a stretchable substrate having a first main surface with a first region, a second region adjacent the first region, and a third region adjacent the second region; a first stretchable wiring line on the first main surface and extending over the first region but not the second region or the third region; an insulating layer extending over the first region and the second region but not the third region; and a second stretchable wiring line extending over the first region, the second region, and the third region. The first stretchable wiring line, the insulating layer, and the second stretchable wiring line overlap each other in the first region, and the insulating layer and the second stretchable wiring line overlap each other in the second region. When a thickness of the insulating layer is defined as $Z2$, and when a minimum value of a length of the second region in an extending direction of the second stretchable wiring line in a plan view of the stretchable wiring board is defined as $Y$, $Y>Z2$.

According to the present invention, it is possible to provide the stretchable wiring board that can suppress breakage of the stretchable wiring line during stretching thereby preventing a short circuit between two stretchable wiring lines when the two stretchable wiring lines are arranged so as to overlap each other.

DETAILED DESCRIPTION OF THE INVENTION

Hereinafter, a stretchable wiring board of the present invention is described. The present invention is not limited to the following configuration and may be appropriately modified without departing from the gist of the present invention. In addition, a combination of a plurality of individual preferred configurations described below may also constitute the present invention.

In the present description, "thickness" denotes a length in a direction perpendicular to the surface of the stretchable substrate in a sectional view thereof. Further, "thickness" and "length" are denoted in a state of the stretchable wiring board not being stretched.

[Stretchable Wiring Board]

Figure 1:
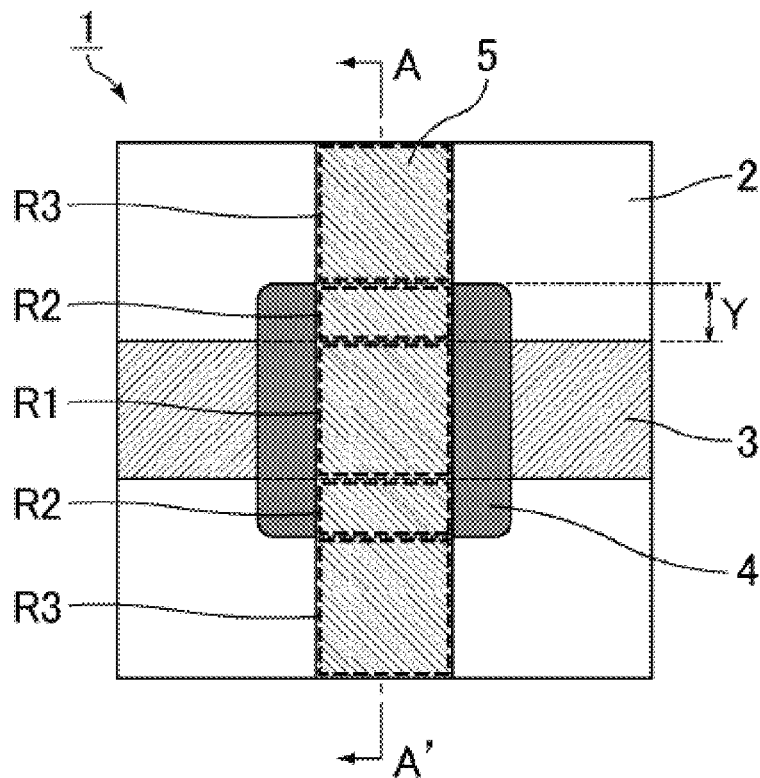
FIG. 1 is a schematic plan view showing an example of a stretchable wiring board of the present invention.
Figure 2:
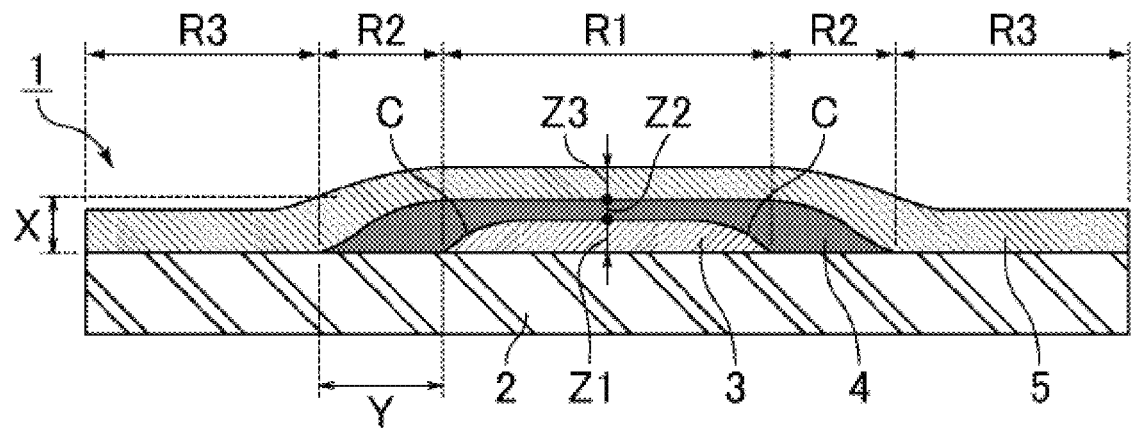
FIG. 2 is a schematic sectional view showing a portion corresponding to line segment A-A' in FIG. 1.

FIG. 1 is a schematic plan view showing an example of the stretchable wiring board of the present invention. FIG. 2 is a schematic sectional view showing a portion corresponding to line segment A-A' in FIG. 1. As shown in FIGS. 1 and 2, a stretchable wiring board 1 has a stretchable substrate 2, a first stretchable wiring line 3, an insulating layer 4, and a second stretchable wiring line 5.

The first stretchable wiring line 3 is arranged on the surface of the stretchable substrate 2.

The insulating layer 4 is arranged so as to overlap a part of the first stretchable wiring line 3 in the plan view.

The second stretchable wiring line 5 is arranged such that a part thereof overlaps the first stretchable wiring line 3 with the insulating layer 4 therebetween in the plan view.

The stretchable wiring board 1 has a first region R1, a second region R2 adjacent to the first region R1, and a third region R3 adjacent to the second region R2 in an extending direction of the second stretchable wiring line 5 (the direction of line segment A-A' in FIG. 1). That is, the second stretchable wiring line 5 extends over the first region R1, the second region R2, and the third region R3.

In the first region R1, the first stretchable wiring line 3, the insulating layer 4, and the second stretchable wiring line 5 are arranged so as to sequentially overlap on the surface of the stretchable substrate 2.

In the second region R2, the insulating layer 4 and the second stretchable wiring line 5 are arranged so as to sequentially overlap on the surface of the stretchable substrate 2. The first stretchable wiring line 3 is not arranged in the second region R2.

In the third region R3, the second stretchable wiring line 5 is arranged on the surface of the stretchable substrate 2. The first stretchable wiring line 3 and the insulating layer 4 are not arranged in the third region R3.

The insulating layer 4 extends over the first region R1 and the second region R2.

With this, the first stretchable wiring line 3 and the second stretchable wiring line 5 are electrically insulated, and a short circuit between the two stretchable wiring lines is prevented.

<Stretchable Substrate>

Examples of the constituent material of the stretchable substrate 2 include a resin material such as thermoplastic polyurethane.

When the stretchable wiring board 1 is, for example, attached to a living body, the thickness of the stretchable substrate 2 is preferably 0.1 µm to 100 µm, more preferably 0.1 µm to 1 µm, from the viewpoint of not inhibiting stretching of the surface of the living body.

<First Stretchable Wiring Line and Second Stretchable Wiring Line>

As the constituent material of the first stretchable wiring line 3 and the second stretchable wiring line 5, a mixture of conductive particles and resin is preferable. Examples of the above mixture include a mixture of a metal powder such as silver, copper, or nickel as conductive particles and an elastomer resin such as a silicone resin. The average particle size of the conductive particles is preferably 0.01 µm to 10 µm. The shape of the conductive particles is preferably spherical. The constituent material of the first stretchable wiring line 3 and the second stretchable wiring line 5 may be the same or different.

The thickness of each of the first stretchable wiring line 3 and the second stretchable wiring line 5 is preferably 1 µm to 100 µm, more preferably 1 µm to 50 µm. The thickness of the first stretchable wiring line 3 and the second stretchable wiring line 5 may be the same or different.

<Insulating Layer>

As the constituent material of the insulating layer 4, a resin material or a mixture of a resin material and an inorganic material is preferable. Examples of the resin material include elastomer resins, such as urethane-based, styrene-based, olefin-based, silicone-based, fluorine-based, nitrile rubber, latex rubber, vinyl chloride, ester-based, and amide-based resins, and epoxy, phenol, acrylic, polyester, imide-based, rosin, cellulose, polyethylene terephthalate-based, polyethylene naphthalate-based, and polycarbonate-based resins.

The thickness of the insulating layer 4 is preferably 5 µm to 100 µm, more preferably 5 µm to 50 µm.

The thickness of the first stretchable wiring line 3 is defined as Z1, the thickness of the insulating layer 4 as Z2, and the thickness of the second stretchable wiring line 5 as Z3 at a position in the first region R1 where the total thickness of the first stretchable wiring line 3, the insulating layer 4, and the second stretchable wiring line 5 is the largest, and the thickness of the second stretchable wiring line 5 at a boundary between the second region R2 and the third region R3 is defined as X. In this case, the stretchable wiring board 1 satisfies the relationship that X is larger than the larger of Z1+Z2 and Z2+Z3 and smaller than Z1+Z2+Z3. If the thickness X of the second stretchable wiring line 5 in a particular observed section is not constant, it is sufficient that both the minimum value and the maximum value of the thickness satisfy the above relationship.

From the viewpoint of suppressing the protrusion in the first region R1, it is preferable that the relation X=Z1+Z2+Z3 is satisfied, but in this case, the stretchability of the second stretchable wiring line 5 is hindered because X is excessive. On the other hand, by making X larger than the larger of Z1+Z2 and Z2+Z3 and smaller than Z1+Z2+Z3 as in the above relationship, X is not excessive, and the difference between Z1+Z2+Z3 and X (the size of the protrusion in the first region R1) is smaller than the smaller of Z1 and Z3. Therefore, the protrusion in the first region R1 is minimized, and the surface of the stretchable wiring board 1 is substantially flat over the first region R1, the second region R2, and the third region R3. Therefore, if the stretchable wiring board 1 is stretched, the stress generated in the first region R1 is suppressed, and as a result, the first stretchable wiring line 3 and the second stretchable wiring line 5 are not easily broken. The above effect can be obtained also when the stretchable wiring board 1 is stretched and bent.

If X is smaller than the larger of Z1+Z2 and Z2+Z3, the first region R1 will protrude significantly. Therefore, when the stretchable wiring board 1 is stretched, the stress tends to concentrate on the first region R1, and as a result, the first stretchable wiring line 3 and the second stretchable wiring line 5 are easily broken.

If X is larger than Z1+Z2+Z3, the vicinity of the boundary between the second region R2 and the third region R3 protrudes greatly. Therefore, when the stretchable wiring board 1 is stretched, stress tends to concentrate in the vicinity of the boundary between the second region R2 and the third region R3, and as a result, the second stretchable wiring line 5 is easily broken.

The stretchable wiring board 1 is manufactured, for example, by forming the first stretchable wiring line 3, the insulating layer 4, and the second stretchable wiring line 5 in this order on the surface of the stretchable substrate 2. In this case, in order that the stretchable wiring board 1 satisfies the relationship that X is larger than the larger of Z1+Z2 and Z2+Z3 and smaller than Z1+Z2+Z3, for example, the following methods (A) and (B) may be adopted.

(A) In the vicinity of the boundary between the second region R2 and the third region R3, the second stretchable wiring line 5 is formed thick (may be formed multiple times in an overlapping manner), and X is increased (gets close to Z1+Z2+Z3).

(B) In the first region R1, the surface of the second stretchable wiring line 5 is scraped to make Z1+Z2+Z3 smaller (closer to X).

When the stretchable wiring board 1 is stretched (or stretched and bent), the first stretchable wiring line 3 and the second stretchable wiring line 5 come close to each other particularly in the vicinity of the boundary between the first region R1 and the second region R2, and a short circuit and electric leakage between the two stretchable wiring lines may easily occur. To deal with this, from the viewpoint of widening the distance between the first stretchable wiring line 3 and the second stretchable wiring line 5 in the vicinity of the boundary between the first region R1 and the second region R2, it is preferable that the stretchable wiring board 1 have the following configuration.

(First Preferred Configuration)

As shown in FIG. 2, in sectional view, corners C of the first stretchable wiring line 3 (corners on the side distant from the stretchable substrate 2; in other words, corners that are not in contact with the stretchable substrate 2) are preferably rounded. With this, the corners C of the first stretchable wiring line 3 are shaped so as to recede toward the inside of the first region R1; therefore, in the vicinity of the boundary between the first region R1 and the second region R2, the distance between the first stretchable wiring line 3 and the second stretchable wiring line 5 is sufficiently wide. Therefore, if the stretchable wiring board 1 is stretched (or stretched and bent), the first stretchable wiring line 3 and the second stretchable wiring line 5 do not come too close to each other, and as a result, a short circuit and electric leakage between the two stretchable wirings are not likely to occur.

In the present specification, the rounded shape denotes a shape in which at least a part of the contour is constituted by a curved line and is generally rounded, and, for example, a shape having a right-angled contour is excluded.

(Second Preferred Configuration)

As shown in FIG. 1, in the plan view, the minimum value of the length of the second region R2 in the extending direction of the second stretchable wiring line 5 is defined as Y. In this case, it is preferable to satisfy the relationship of Y>Z2. With this, the insulating layer 4 is thicker in the vicinity of the corners C of the first stretchable wiring line 3, and therefore, the distance between the first stretchable wiring line 3 and the second stretchable wiring line 5 is sufficiently wide in the vicinity of the boundary of the first region R1 and the second region R2. Therefore, if the stretchable wiring board 1 is stretched (or stretched and bent), the first stretchable wiring line 3 and the second stretchable wiring line 5 do not come too close to each other, and as a result, a short circuit and electric leakage between the two stretchable wirings are unlikely to occur.

The stretchable wiring board 1 is formed such that, in the plan view, the first stretchable wiring line 3 and the second stretchable wiring line 5 may intersect as shown in FIG. 1 or parts of the above stretchable wiring lines may overlap without intersecting each other. If the first stretchable wiring line 3 and the second stretchable wiring line 5 intersect each other, the intersection angle may be a right angle or an angle other than a right angle.

Figure 3:
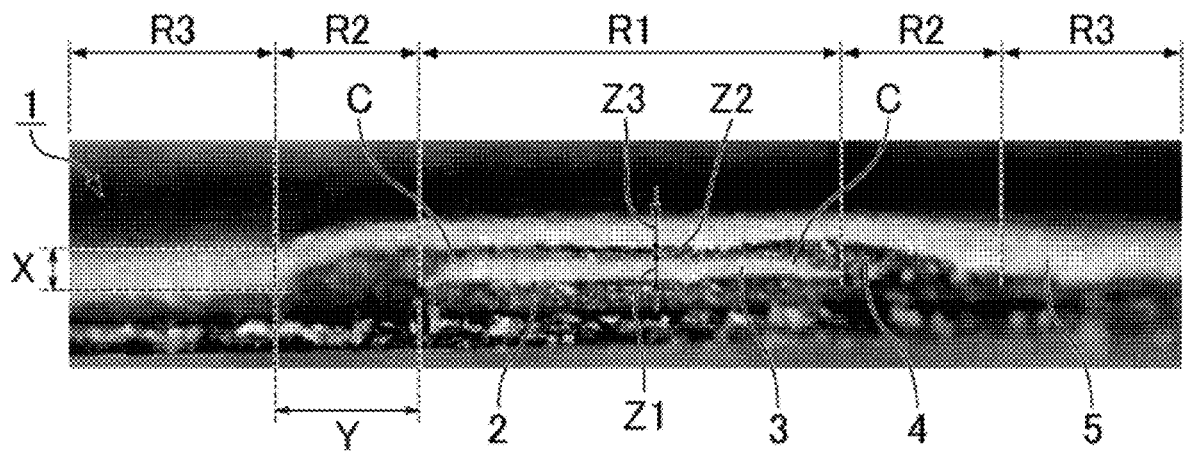
FIG. 3 is a sectional photograph showing an example of the stretchable wiring board of the present invention.

FIG. 3 is a sectional photograph showing an example of the stretchable wiring board of the present invention. As shown in FIG. 3, in the sectional photograph of the stretchable wiring board 1, the relationship of X being larger than the larger of Z1+Z2 and Z2+Z3 and smaller than Z1+Z2+Z3 is satisfied. It can also be seen that the corners C of the first stretchable wiring line 3 each have the rounded shape and that the relationship of Y>Z2 is satisfied.

Figure 4:
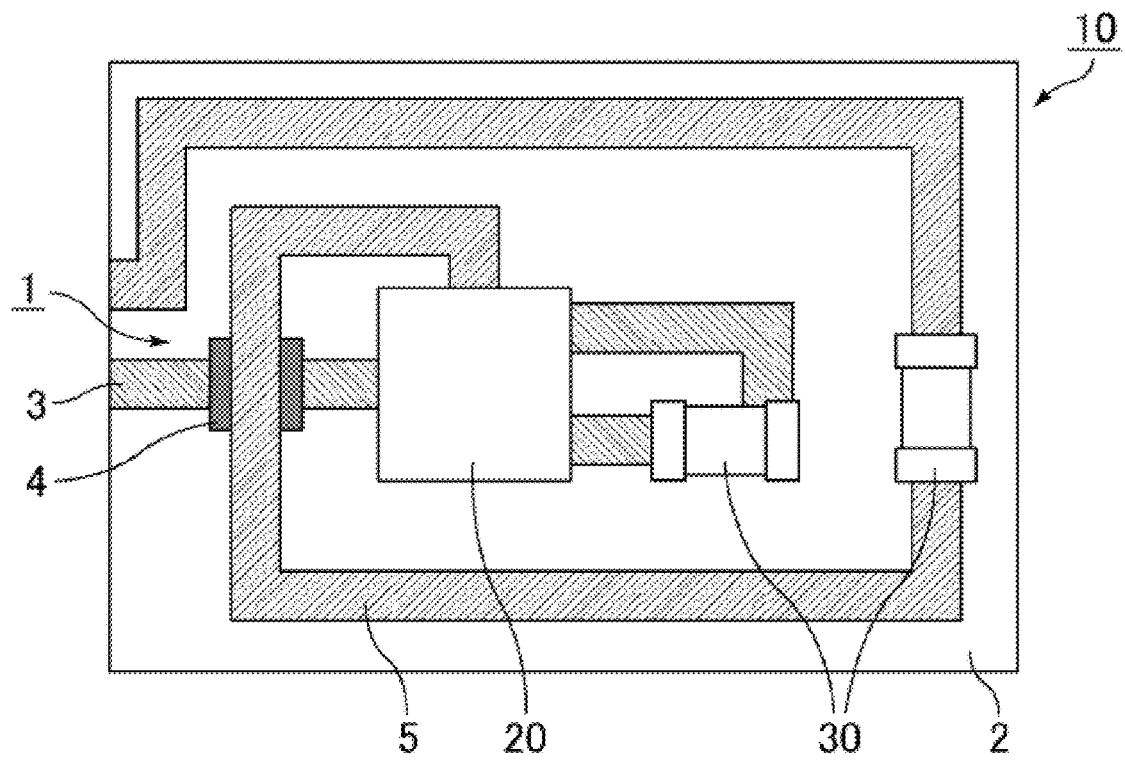
FIG. 4 is schematic plan view showing an example of a mounting board having electronic components that are mounted on the stretchable wiring board of the present invention.

Electronic components may be mounted on the stretchable wiring board 1. FIG. 4 is a schematic plan view showing an example of a mounting board having electronic components that are mounted on the stretchable wiring board of the present invention. As shown in FIG. 4, a mounting board 10 includes the stretchable wiring board 1 and chip components 20 and 30 as electronic components mounted on the stretchable wiring board 1.

Examples of the chip components 20 and 30 include amplifiers (operational amplifiers, transistors, etc.), resistors, capacitors, inductors, and others.

The mounting board 10 (stretchable wiring board 1) can be used as a sensor by being attached to a living body (for example, a human body).

The mounting board 10 (stretchable wiring board 1) may further include an adhesive layer having biocompatibility on the surface of the stretchable substrate 2 on the side opposite to the first stretchable wiring line 3, the insulating layer 4, the second stretchable wiring line 5, and the chip components 20 and 30. With this configuration, the mounting board 10 (stretchable wiring board 1) can be easily attached to the living body. The entirety of the mounting board 10 (stretchable wiring board 1) may alternatively be fixed to the living body by taping.

The whole of the mounting board 10 (stretchable wiring board 1) may be coated with a biocompatible resin material. With this configuration, contact of the first stretchable wiring line 3, the second stretchable wiring line 5, and the chip components 20 and 30 with the living body is prevented.

The mounting board 10 (stretchable wiring board 1) may have a portion where the skin of the living body is exposed to outside air or which easily allows ventilation in a region where the first stretchable wiring line 3, the second stretchable wiring line 5, and the chip components 20 and 30 are not arranged. With this configuration, the mounting board 10 (stretchable wiring board 1) has enhanced ventilation with the skin of the living body.

DESCRIPTION OF REFERENCE SYMBOLS

1: Stretchable wiring board
2: Stretchable substrate
3: First stretchable wiring line
4: Insulating layer
5: Second stretchable wiring line
10: Mounting board
20, 30: Chip component
R1: First region
R2: Second region
R3: Third region
Z1: Thickness of first stretchable wiring line
Z2: Thickness of insulating layer
X, Z3: Thickness of second stretchable wiring line
C: Corner of first stretchable wiring line
Y: Minimum value of length of second region

The invention claimed is:

1. A stretchable wiring board comprising:
a stretchable substrate having a first main surface with a first region, a second region adjacent the first region, and a third region adjacent the second region;
a first stretchable wiring line on the first main surface and extending over the first region but not the second region or the third region;
an insulating layer extending over the first region and the second region but not the third region; and
a second stretchable wiring line extending over the first region, the second region, and the third region such that:
the first stretchable wiring line, the insulating layer, and the second stretchable wiring line overlap each other in the first region,
the insulating layer and the second stretchable wiring line overlap each other in the second region, and
when a thickness of the insulating layer is defined as $Z2$, and when a minimum value of a length of the second region in an extending direction of the second stretchable wiring line in a plan view of the stretchable wiring board is defined as $Y$, $Y>Z2$.

2. The stretchable wiring board according to claim 1, wherein the first stretchable wiring line has rounded corners in a sectional view thereof.

3. The stretchable wiring board according to claim 1, wherein the first stretchable wiring line and the second stretchable wiring line intersect each other in a plan view of the stretchable wiring board.

4. The stretchable wiring board according to claim 1, wherein a thickness of the stretchable substrate is 0.1 µm to 100 µm.

5. The stretchable wiring board according to claim 1, wherein a thickness of each of the first stretchable wiring line and the second stretchable wiring line is 1 µm to 100 µm.

6. The stretchable wiring board according to claim 1, wherein a thickness of the insulating layer is 5 µm to 100 µm.

7. The stretchable wiring board according to claim 1, wherein a thickness of the stretchable substrate is 0.1 µm to 100 µm, a thickness of each of the first stretchable wiring line and the second stretchable wiring line is 1 µm to 100 µm, and a thickness of the insulating layer is 5 µm to 100 µm.

8. A mounting board, comprising:
the stretchable wiring board according to claim 1; and
one or more electronic components mounted on the stretchable substrate and electrically connected to at least one of the first stretchable wiring line and the second stretchable wiring line.

9. The mounting board according to claim 8, wherein the first stretchable wiring line has rounded corners in a sectional view thereof.

10. The mounting board according to claim 8, wherein the first stretchable wiring line and the second stretchable wiring line intersect each other in a plan view of the stretchable wiring board.

11. The mounting board according to claim 8, wherein a thickness of the stretchable substrate is 0.1 µm to 100 µm.

12. The mounting board according to claim 8, wherein a thickness of each of the first stretchable wiring line and the second stretchable wiring line is 1 µm to 100 µm.

13. The mounting board according to claim 8, wherein a thickness of the insulating layer is 5 µm to 100 µm.

14. The mounting board according to claim 8, wherein a thickness of the stretchable substrate is 0.1 µm to 100 µm, a thickness of each of the first stretchable wiring line and the second stretchable wiring line is 1 µm to 100 µm, and a thickness of the insulating layer is 5 µm to 100 µm.

\* \* \* \* \*